(12) United States Patent
Yokoyama et al.

(10) Patent No.: US 10,418,295 B2
(45) Date of Patent: Sep. 17, 2019

(54) POWER MODULE

(71) Applicant: Mitsubishi Electric Corporation, Chiyoda-ku (JP)

(72) Inventors: Yoshinori Yokoyama, Chiyoda-ku (JP); Shinnosuke Soda, Chiyoda-ku (JP); Narihito Ota, Chiyoda-ku (JP); Kazuyasu Nishikawa, Chiyoda-ku (JP); Akihisa Fukumoto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/061,019

(22) PCT Filed: Nov. 4, 2016

(86) PCT No.: PCT/JP2016/082858
§ 371 (c)(1),
(2) Date: Jun. 11, 2018

(87) PCT Pub. No.: WO2017/130512
PCT Pub. Date: Aug. 3, 2017

(65) Prior Publication Data
US 2018/0366383 A1  Dec. 20, 2018

(30) Foreign Application Priority Data

Jan. 28, 2016  (JP) ................. 2016-014297

(51) Int. Cl.
*H01L 23/13*   (2006.01)
*H01L 23/12*   (2006.01)
(Continued)

(52) U.S. Cl.
CPC .............. *H01L 23/13* (2013.01); *H01L 23/12* (2013.01); *H01L 23/36* (2013.01);
(Continued)

(58) Field of Classification Search
CPC ......... H01L 23/13; H01L 24/32; H01L 23/40; H01L 23/36; H01L 23/3735; H01L 23/12; H01L 29/7393; H01L 2224/32225
See application file for complete search history.

(56) References Cited

U.S. PATENT DOCUMENTS 5,654,586 A    8/1997  Schwarzbauer
2010/0102431 A1*  4/2010  Atsumi ............... H01L 23/3735
                                                      257/690
(Continued)

FOREIGN PATENT DOCUMENTS

JP    59-56788 A    4/1984
JP    06-140540 A   5/1994
(Continued)

OTHER PUBLICATIONS

Office Action dated May 11, 2017 in Japanese application No. 2017-516533 (with partial English translation).
(Continued)

*Primary Examiner* — Victor A Mandala
(74) *Attorney, Agent, or Firm* — Oblon, McClelland, Maier & Neustadt, L.L.P.

(57) ABSTRACT

A power module includes an insulated circuit board, a semiconductor element, a first buffer plate, and first and second joining materials. The semiconductor element is disposed on a side of one main surface of the insulated circuit board. The first buffer plate is disposed between the insulated circuit board and the semiconductor element. The first joining material is divided into a plurality of portions in a plan view. The first buffer plate is higher in coefficient of linear expansion than the semiconductor element and lower in coefficient of linear expansion than the insulated circuit board. The first buffer plate is lower in Young's modulus than the semiconductor element.

14 Claims, 9 Drawing Sheets

(51) Int. Cl.
*H01L 23/373* (2006.01)
*H01L 23/36* (2006.01)
*H01L 23/40* (2006.01)
*H01L 23/00* (2006.01)
*H01L 29/739* (2006.01)

(52) U.S. Cl.
CPC .......... *H01L 23/3735* (2013.01); *H01L 23/40* (2013.01); *H01L 24/32* (2013.01); *H01L 29/7393* (2013.01); *H01L 2224/32225* (2013.01)

(56) References Cited

U.S. PATENT DOCUMENTS

| | | | |
|---|---|---|---|
| 2010/0109016 A1 | 5/2010 | Yagi et al. | |
| 2011/0309512 A1* | 12/2011 | Gejima | H01L 23/053 257/771 |
| 2012/0138946 A1* | 6/2012 | Kikuchi | H01L 23/3735 257/76 |
| 2018/0182716 A1* | 6/2018 | Miyazaki | B60R 16/02 |

FOREIGN PATENT DOCUMENTS

| | | |
|---|---|---|
| JP | 08-509844 A | 10/1996 |
| JP | 09-232339 A | 9/1997 |
| JP | 2005-39081 A | 2/2005 |
| JP | 2006-315183 A | 11/2006 |
| JP | 2008-147469 A | 6/2008 |
| JP | 2008-270353 A | 11/2008 |
| JP | 2009-88476 A | 4/2009 |
| JP | 2010-227963 A | 10/2010 |

OTHER PUBLICATIONS

International Search Report dated Dec. 27, 2016 in PCT/JP2016/082858, filed on Nov. 4, 2016.

* cited by examiner

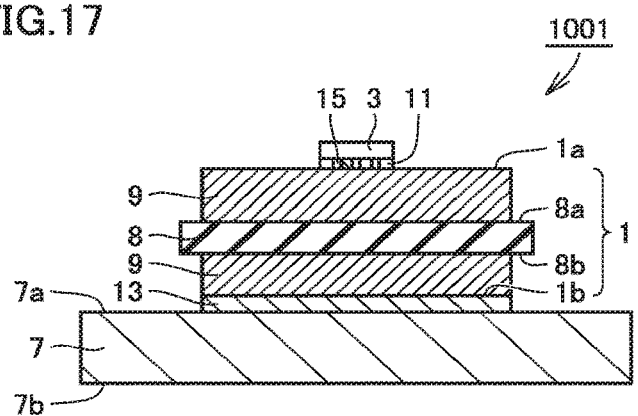
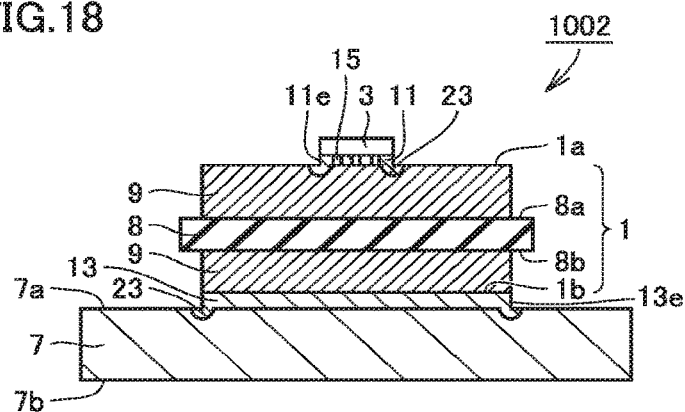
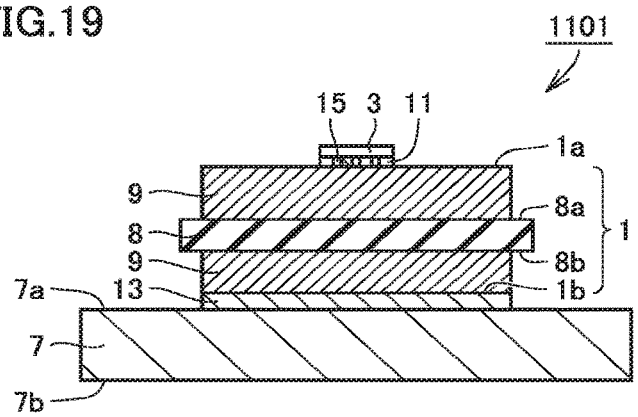

POWER MODULE

TECHNICAL FIELD

The present invention relates to a power module, and particularly to a power module for which heat dissipation performance is required.

BACKGROUND ART

A power module on which power semiconductor elements such as an insulated gate bipolar transistor (IGBT) are mounted is required to efficiently dissipate heat generated by the semiconductor elements to the outside while ensuring the insulation performance between the semiconductor elements and their surroundings. A conventional direct cooling-type power module not using grease is formed of: an insulated circuit board including a ceramic plate having main surfaces on which metal thin films are formed; a power semiconductor element joined onto one of the main surfaces with a joining material interposed therebetween; and a cooler joined onto the other main surface.

However, depending on the conditions that such a direct cooling-type power module is used, there is a large difference in coefficient of linear expansion between the semiconductor element and the cooler, thereby producing cracks in each of joining portions, with the result that the required heat dissipation performance may not be achieved. Thus, for example, in Japanese Patent National Publication No. 08-509844 (PTD 1), a semiconductor element is joined onto a conductor path on a ceramic substrate, and the ceramic substrate and a metal bottom plate below the ceramic substrate are joined to each other with a buffer layer interposed therebetween. The joining layer between the ceramic substrate and the buffer layer, and the joining layer between the buffer layer and the metal bottom plate each are made of sintered silver. Fatigues and crack formation caused by the difference in coefficient of linear expansion between the ceramic substrate and the metal bottom plate are avoided by plastic deformation of the buffer layer.

However, in PTD 1, there is no buffer layer provided between the semiconductor element and the ceramic substrate, which is thus less effective in diffusing the heat of the semiconductor element in the direction along its main surface. On the other hand, for example, Japanese Patent Laying-Open No. 2008-147469 (PTD 2) discloses a configuration in which a stress buffer plate is provided directly below a semiconductor element with a joining material interposed therebetween. This improves the effect of causing the heat generated by the semiconductor element to be diffused directly therebelow.

CITATION LIST

Patent Document

PTD 1: Japanese Patent National Publication No. 08-509844
PTD 2: Japanese Patent Laying-Open No. 2008-147469

SUMMARY OF INVENTION

Technical Problem

For example, as a joining material for joining a ceramic substrate and a buffer layer, a paste-like joining material is applied, for example. When this joining material is heated to join the ceramic substrate and the buffer layer to each other, a binder contained in the joining material tends to remain. When the ceramic substrate and the buffer layer are joined to each other while the binder remains, there occur problems that the subsequent joining strength of the joining layer becomes weak, and the heat conductivity in the joining layer becomes insufficient.

The present invention has been made in light of the above-described problems. An object of the present invention is to provide a power module that allows the joining strength of the joining layer to be increased and also allows its heat conductivity to be further improved.

Solution to Problem

A power module according to one embodiment of the present invention includes an insulated circuit board, a semiconductor element, a first buffer plate, a first joining material, a second joining material, and a heat dissipation member. The semiconductor element is disposed on a side of one main surface of the insulated circuit board. The first buffer plate is disposed between the insulated circuit board and the semiconductor element. The first joining material is disposed between the insulated circuit board and the first buffer plate. The second joining material is disposed between the semiconductor element and the first buffer plate. The heat dissipation member is disposed on a side of the other main surface on an opposite side of the one main surface of the insulated circuit board. The first joining material is divided into a plurality of portions in a plan view. The first buffer plate is higher in coefficient of linear expansion than the semiconductor element and lower in coefficient of linear expansion than the insulated circuit board. The first buffer plate is lower in Young's modulus than the semiconductor element.

A power module according to another embodiment of the present invention includes an insulated circuit board, a semiconductor element, a second joining material, and a heat dissipation member. The semiconductor element is disposed on a side of one main surface of the insulated circuit board. The second joining material is disposed between the insulated circuit board and the semiconductor element. The heat dissipation member is disposed on a side of the other main surface on an opposite side of the one main surface of the insulated circuit board. The second joining material is divided into a plurality portions in a plan view.

Advantageous Effects of Invention

According to the present invention, the binder contained in the joining material can be efficiently discharged through a path formed by dividing the first joining material into a plurality portions, so that the reliability of the first joining material can be improved.

BRIEF DESCRIPTION OF DRAWINGS

FIG. 17 is a schematic cross-sectional view showing the first example of the configuration of a power module in the tenth embodiment.

FIG. 18 is a schematic cross-sectional view showing the second example of the configuration of the power module in the tenth embodiment.

FIG. 19 is a schematic cross-sectional view showing the configuration of a power module in the eleventh embodiment.

DESCRIPTION OF EMBODIMENTS

The embodiments of the present invention will be hereinafter described with reference to the accompanying drawings. In the following description, when names of metal materials such as copper and aluminum are mentioned without being specifically designated, it is assumed that these metal materials include a copper alloy and an aluminum alloy each containing other additives.

First Embodiment

Figure 1:
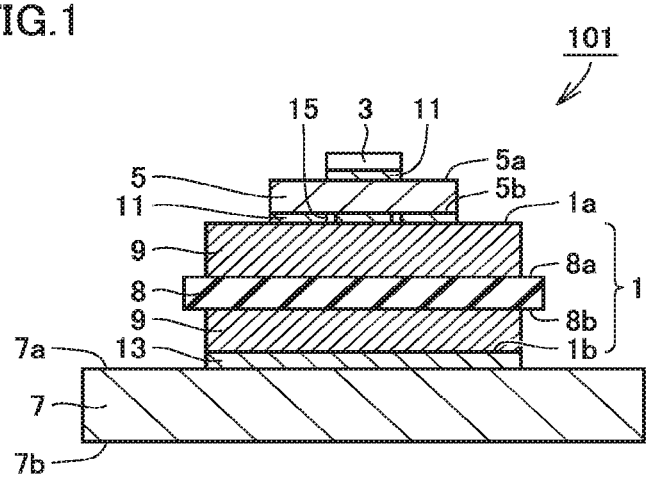
FIG. 1 is a schematic cross-sectional view showing the configuration of a power module in the first embodiment.

First, the configuration of a power module in the present embodiment will be hereinafter described with reference to FIGS. 1 to 3. Referring to FIG. 1, a power module 101 in the present embodiment mainly includes an insulated circuit board 1, a semiconductor element 3, a buffer plate 5 (the first buffer plate), and a base substrate 7 (a heat dissipation member).

Insulated circuit board 1 includes: an insulating ceramic plate 8 formed in a flat plate shape and having one main surface 8a and the other main surface 8b on the opposite side thereof; and a conductor thin film 9 formed to be stacked on each of one main surface 8a and the other main surface 8b of insulating ceramic plate 8. In other words, insulated circuit board 1 has a configuration in which insulating ceramic plate 8 is sandwiched between conductor thin films 9 from both sides on one main surface 8a and the other main surface 8b. In FIG. 1, each conductor thin film 9 is formed so as to almost entirely cover a corresponding one of one main surface 8a and the other main surface 8b, but may be formed so as to only partially cover a corresponding one of main surfaces 8a and 8b. At least in FIG. 1, each conductor thin film 9 almost entirely covers a corresponding one of one main surface 8a and the other main surface 8b in FIG. 1. Accordingly, one main surface 1a of entire insulated circuit board 1 is formed on the surface of conductor thin film 9 on one main surface 8a of insulating ceramic plate 8, and the other main surface 1b of entire insulated circuit board 1 is formed on the surface of conductor thin film 9 on the other main surface 8b of insulating ceramic plate 8.

Semiconductor element 3 is, for example, a thin plate-shaped semiconductor chip having an IGBT mounted thereon and disposed on the one main surface 1a side of insulated circuit board 1a, that is, on the upper side in FIG. 1. Buffer plate 5 is disposed between insulated circuit board 1 and semiconductor element 3. Buffer plate 5 is formed in a flat plate shape having one main surface 5a on the semiconductor element 3 side, that is, on the upper side in FIG. 1 and having the other main surface 5b on the insulated circuit board 1 side, that is, on the lower side in FIG. 1. Thus, semiconductor element 3 is joined onto one main surface 5a of buffer plate 5.

Also, base substrate 7 is disposed on the other main surface 1b side on the opposite side of one main surface 1a of insulated circuit board 1, that is, on the lower side in FIG. 1. Base substrate 7 is formed in a flat plate shape having one main surface 7a on the insulated circuit board 1 side, that is, on the upper side in FIG. 1 and the other main surface 7b on the opposite side of one main surface 7a.

A joining material 11 (the first joining material) is disposed between insulated circuit board 1 and buffer plate 5. In other words, buffer plate 5 is joined onto one main surface 1a of insulated circuit board 1 with joining material 11 interposed therebetween. Furthermore, joining material 11 (the second joining material) is disposed also between semiconductor element 3 and buffer plate 5. In other words, semiconductor element 3 is joined onto one main surface 5a of buffer plate 5 with joining material 11 interposed therebetween. Furthermore, a joining material 13 is disposed between insulated circuit board 1 and base substrate 7. In other words, base substrate 7 is joined onto the other main surface 1b of insulated circuit board 1 with joining material 13 interposed therebetween.

As shown in FIG. 1, in power module 101, the members located on the lower side in the figure are basically larger in area in a plan view than the members on the upper side in the figure. Specifically, buffer plate 5 is larger in area than semiconductor element 3, insulated circuit board 1 is larger in area than buffer plate 5, and base substrate 7 is larger in area than insulated circuit board 1.

Figure 2:
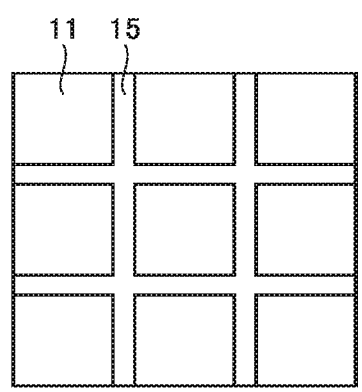
FIG. 2 is a schematic plan view particularly showing the first example of the configuration of a first joining material disposed between an insulated circuit board and a first buffer plate in FIG. 1.

Referring to FIG. 2, in power module 101, joining material 11 between insulated circuit board 1 and buffer plate 5 has, for example, a rectangular shape (a square shape) in a plan view, and is divided into a plurality of portions by a dividing line 15. For example, in FIG. 2, two dividing lines 15 are formed in the longitudinal direction and in the lateral direction so as to extend along the end face of joining material 11 in a plan view. Since dividing line 15 is formed as a region from which the member forming joining material 11 is removed, the member forming joining material 11 is not provided in dividing line 15. Then, joining materials 11 are arranged in three rows in the longitudinal direction and in three lines in the lateral direction so as to be spaced apart by dividing lines 15 from each other. In the first example in FIG. 2, divided joining materials 11 are arranged in a grid pattern.

A paste material is applied onto joining material 11, which is then sintered, for example, to thereby join insulated circuit board 1 and buffer plate 5. This paste material is applied by methods such as a commonly-known screen printing method or a dispenser applying method. Depending on the type, the amount and the like of the binder contained in the paste material, the thickness of joining material 11 and the width of dividing line 15 (the width in the direction along one main surface 1a of insulated circuit board 1) are changed. Thus, the size of joining material 11 after being sintered will be hereinafter described. The width in a plan view in the direction intersecting with the extending direction of each dividing line 15 is, for example, preferably equal to or greater than 10 μm and also preferably equal to or less than the thickness of joining material 11. The same applies to the case where dividing line 15 is formed not only in joining material 11 as the first joining material shown in FIG. 2 but also in joining material 11 as the second joining material, for example, as will be described later.

Figure 3:
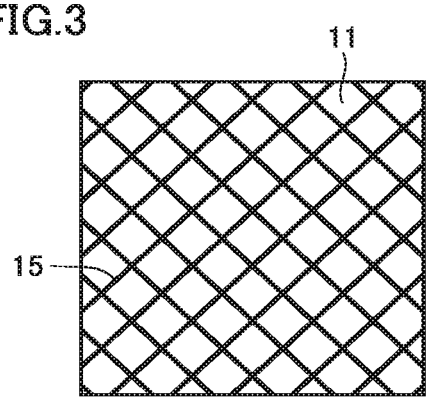
FIG. 3 is a schematic plan view particularly showing the second example of the configuration of the first joining material disposed between the insulated circuit board and the first buffer plate in FIG. 1.

Referring to FIG. 3, a plurality of dividing lines 15 may extend to be spaced apart from each other in the oblique direction with respect to the end face of joining material 11 in a plan view, in which divided joining materials 11 each may have a rhombus shape, for example. In this case, a pair of adjoining dividing lines 15 extending from the upper left to the lower right in FIG. 4 and a pair of adjoining dividing lines 15 extending from the upper right to the lower left in FIG. 4 intersect with each other so as to form a rhombus shape.

In FIGS. 2 and 3, the edge portion of dividing line 15 is formed in an angular shape, but may be formed in a rounded R shape. In this way, the stress concentration at joining material 11 can be alleviated. Similarly, the outer edge portion in entire joining material 11 may also be formed in a rounded R shape.

In FIG. 1, dividing line 15 is not provided in second joining material 11, but may be provided also in second joining material 11 as in first joining material 11.

Then, the material and the like of each of members forming power module 101 described above will be described below.

It is preferable that insulating ceramic plate 8 constituting insulated circuit board 1 is formed of a highly heat-conductive ceramic material such as silicon nitride, aluminum nitride or alumina, for example. It is also preferable that conductor thin film 9 is made of a good conductor of electricity and heat such as copper or aluminum, for example. Although FIG. 1 shows that conductor thin film 9 is formed of a single layer, conductor thin film 9 may be formed of a plurality of layers obtained, for example, by stacking a copper thin film and an aluminum foil film. Although not shown, in insulated circuit board 1, conductor thin film 9 may be directly joined onto one main surface 8a and the other main surface 8b of insulating ceramic plate 8 without using a wax material and the like, or may be joined onto one main surface 8a and the other main surface 8b of insulating ceramic plate 8 using a wax material and the like.

Semiconductor element 3 is a chip-shaped member made of silicon or silicon carbide (SiC).

Base substrate 7 serves as a member for receiving the heat generated by semiconductor element 3 from the one main surface 7a side and dissipating the heat from the other main surface 7b side to the outside. It is preferable that base substrate 7 is a good conductor of heat, which is made of aluminum or copper. Base substrate 7, which is a heat dissipation member, may be configured such that a heat dissipation mechanism (not shown) is joined onto the other main surface 7b in FIG. 1. In other words, base substrate 7 and the heat dissipation mechanism (not shown) may be combined to dissipate the heat generated from semiconductor element 3. This heat dissipation mechanism (not shown) is a liquid cooling-type water jacket or an air cooling-type heat sink, for example, in which case the cooling type can be selected depending on the intended use. In this way, base substrate 7 may be connected to another heat dissipation mechanism, both of which may be combined to perform a function of dissipating heat, but base substrate 7 may be disposed alone as a heat dissipation mechanism. When base substrate 7 is disposed alone as a heat dissipation mechanism in the state where another heat dissipation mechanism is not connected thereto, the heat dissipation efficiency of the entire system is rather further improved. Thus, from the above-described viewpoint, it is more preferable that base substrate 7 is used alone as a heat dissipation mechanism.

FIG. 1 shows: joining material 11 as the first joining material disposed between insulated circuit board 1 and buffer plate 5; and joining material 11 as the second joining material disposed between buffer plate 5 and semiconductor element 3, in which each of these joining materials 11 is preferably formed of a low-temperature sintered material made using silver nanoparticles, for example. However, joining material 11 may be made of: a liquid-phase diffusion joining material such as copper-tin; or solder. In the present specification, joining material 11 is hereinafter assumed to be formed of a low-temperature sintered material made using silver nanoparticles, that is, formed of sintered silver. In other words, joining material 11 as the first joining material is made of a conductor material. However, since joining material 11 is used to connect conductor thin film 9 of insulated circuit board 1 and buffer plate 5 made of a metal material such as an alloy, it can join conductor thin film 9 and buffer plate 5 without causing any problems due to excellent wettability even if this joining material 11 is made of a conductor material.

It is preferable that joining material 13 disposed between insulated circuit board 1 and base substrate 7 in FIG. 1 is made of solder, for example. However, joining material 13 may be made of a low-temperature sintered material made using silver nanoparticles or a liquid-phase diffusion joining material such as copper-tin. In the present specification, joining material 13 is hereinafter assumed to be made of solder.

In order to alleviate the thermal stress caused between insulated circuit board 1 and semiconductor element 3 by joining these insulated circuit board 1 and semiconductor element 3 that are different in coefficient of linear expansion, buffer plate 5 is disposed so as to be sandwiched between insulated circuit board 1 and semiconductor element 3. Accordingly, buffer plate 5 is formed of a material that is higher in coefficient of linear expansion than semiconductor element 3 and lower in coefficient of linear expansion than insulated circuit board 1. In this case, the increasing order of the coefficient of linear expansion is as follows: specifically, semiconductor element 3, buffer plate 5, and insulated circuit board 1. The coefficient of linear expansion of insulated circuit board 1 herein means the entire coefficient of linear expansion of: insulating ceramic plate 8; and conductor thin films 9 on one main surface 8a and the other main surface 8b of insulating ceramic plate 8, which form insulated circuit board 1. Furthermore, buffer plate 5 is formed of a material that is lower in Young's modulus than semiconductor element 3.

For example, when semiconductor element 3 is made of silicon carbide, the coefficient of linear expansion of semiconductor element 3 is $4.6 \times 10^{-6}/°$ C. For example, when semiconductor element 3 is made of silicon, the coefficient of linear expansion of semiconductor element 3 is $2.5 \times 10^{-6}/°$ C. When insulated circuit board 1 is formed of insulating ceramic plate 8 made of silicon nitride and conductor thin film 9 made of copper, the coefficient of linear expansion of the entire insulated circuit board 1 varies in accordance with the proportion of volumes that is, thicknesses, of insulating ceramic plate 8 and conductor thin film 9. The apparent coefficient of linear expansion of the entire insulated circuit board 1 obtained by analysis varies in the range of $4.8 \times 10^{-6}/°$ C. or more and $14.5 \times 10^{-6}/°$ C. or less. Furthermore, the coefficient of linear expansion of base substrate 7 made of aluminum is $24 \times 10^{-6}/°$ C.

Therefore, the difference in coefficient of linear expansion between semiconductor element 3 and insulated circuit board 1 is smaller when semiconductor element 3 is made of silicon carbide than when semiconductor element 3 is made of silicon. Thus, the stress between semiconductor element 3 and insulated circuit board 1 can be reduced. However, semiconductor element 3 made of silicon has a Young's modulus (modulus of longitudinal elasticity) of 169.7 GPa, whereas semiconductor element 3 made of silicon carbide has a Young's modulus of 430 GPa. In other words, semiconductor element 3 made of silicon carbide is extremely high in rigidity. Thus, when semiconductor element 3 made of silicon carbide is used, the stress between this semiconductor element 3 and insulated circuit board 1 needs to be further alleviated. In view of the above, it can be said that buffer plate 5 that should be lower in Young's modulus than semiconductor element 3 is preferably formed to have a Young's modulus less than 430 GPa.

Furthermore, the coefficient of linear expansion of insulated circuit board 1 changes in accordance with the proportion of the volumes of insulating ceramic plate 8 and conductor thin film 9 as described above. However, even if this coefficient of linear expansion is changed in any manner, the trade-off relation is established between jointing on the one main surface 1a side (semiconductor element 3) and jointing on the other main surface 1b side (base substrate 7). Accordingly, in FIG. 1, the trade-off relation is established between the lifetime of joining material 11 made of sintered silver and the lifetime of joining material 13 made of solder.

Specifically, for example, when conductor thin film 9 made of copper in insulated circuit board 1 is increased in thickness to improve the heat diffusion performance thereof, the coefficient of linear expansion of insulated circuit board 1 is increased. Thereby, the difference in coefficient of linear expansion between base substrate 7 and insulated circuit board 1 is decreased, but the difference in coefficient of linear expansion between semiconductor element 3 and insulated circuit board 1 is increased to the contrary. Accordingly, the stress onto joining material 13 made of solder is alleviated, whereas the stress onto joining material 11 made of sintered silver is increased, so that the lifetime of joining material 11 may be shortened. On the other hand, when the proportion of insulating ceramic plate 8 in insulated circuit board 1 is increased, the coefficient of linear expansion of insulated circuit board 1 is decreased. Thereby, the difference in coefficient of linear expansion between semiconductor element 3 and insulated circuit board 1 is decreased, but the difference in coefficient of linear expansion between base substrate 7 and insulated circuit board 1 is increased to the contrary. Accordingly, the stress onto joining material 11 made of sintered silver is alleviated, whereas the stress onto joining material 13 made of solder is increased, so that the lifetime of joining material 13 may be shortened.

In consideration of the trade-off relation as described above, it is preferable that buffer plate 5 that is higher in coefficient of linear expansion than semiconductor element 3, lower in coefficient of linear expansion than insulated circuit board 1 and lower in Young's modulus than semiconductor element 3 is formed of the following materials. Specifically, it is preferable that buffer plate 5 is formed of any one selected from the group consisting of: a chromium-copper alloy; a cladding material formed by stacking a chromium-copper alloy and copper; a copper-molybdenum alloy; and a cladding material of a copper-molybdenum alloy and copper. In this case, the chromium-copper alloy has a coefficient of linear expansion of $7 \times 10^{-6}/°$ C. or more and $10 \times 10^{-6}/°$ C. or less, and the cladding material of a chromium-copper alloy and copper has a coefficient of linear expansion of $8 \times 10^{-6}/°$ C. or more and $12 \times 10^{-6}/°$ C. or less. Furthermore, the copper-molybdenum alloy has a coefficient of linear expansion of $7 \times 10^{-6}/°$ C. or more and $11.1 \times 10^{-6}/°$ C. or less, in which the Young's modulus varies in the range of 280 GPa to 170 GPa. Furthermore, the cladding material of a copper-molybdenum alloy and copper has a coefficient of linear expansion of $8.5 \times 10^{-6}/°$ C. or more and $11.5 \times 10^{-6}/°$ C. or less, in which the Young's modulus varies in the range of 160 GPa to 120 GPa.

In addition to relaxation of the stress between semiconductor element 3 and insulated circuit board 1 by arranging therebetween buffer plate 5 that has a coefficient of linear expansion of a value between the coefficient of linear expansion of semiconductor element 3 and the coefficient of linear expansion of insulated circuit board 1, buffer plate 5 serves to cause the heat dissipated from semiconductor element 3 to be diffused in the direction along each of main surfaces 5a and 5b Semiconductor element 3 made of SiC generates a large quantity of heat as a power semiconductor element. Since this semiconductor element 3 is reduced in thickness, the large quantity of generated heat is transmitted downward before it is diffused in the lateral direction along the main surfaces. Thus, in order to cause the heat to be diffused more in the lateral direction along the main surfaces of semiconductor element 3 and the like, this heat is diffused by buffer plate 5 in the direction along one main surface 5a and the other main surface 5b of this buffer plate 5. For example, the heat conductivity in buffer plate 5 made of a copper-molybdenum alloy is 160 W/(m·K) or more and 286 W/(m·K) or less, and the heat conductivity in buffer plate 5 made of a cladding material of a copper-molybdenum alloy and copper reaches to 220 W/(m·K) or more and 300 W/(m·K) or less. Accordingly, such buffer plate 5 is extremely effective also in heat diffusion in its lateral direction.

The functions and effects of the present embodiment will then be described.

In power module 101 in the present embodiment, as described above, buffer plate 5 that is higher in coefficient of linear expansion than semiconductor element 3, lower in coefficient of linear expansion than insulated circuit board 1 and lower in Young's modulus than semiconductor element 3 is provided between insulated circuit board 1 and semiconductor element 3. This allows alleviation of the stress in the joining portion between semiconductor element 3 and insulated circuit board 1 caused by the difference in coefficient of linear expansion between semiconductor element 3 and insulated circuit board 1, so that fatigues and cracks in the joining portion can be suppressed, and progress of cracks can be delayed.

Furthermore, buffer plate 5 has a relatively high heat conductivity of 160 W/(m·K) or more, for example, which thereby can improve the efficiency of causing the heat transmitted to this buffer plate 5 to be diffused in the direction along one main surface 5a and the other main surface 5b of buffer plate 5. Furthermore, insulated circuit board 1 and buffer plate 5 are larger in plane area than semiconductor element 3. Thus, the heat transmitted from semiconductor element 3 to buffer plate 5 is subsequently transmitted through a larger area range due to the extension of buffer plate 5 in the lateral direction, with the result that its heat resistance can be reduced. Accordingly, the heat resistance in the heat path from semiconductor element 3 as a heat generating body downwardly in FIG. 1 to base substrate 7 is extremely reduced, so that excellent heat conductivity can be achieved.

In the case where buffer plate 5, insulated circuit board 1 and the like that are larger in plane area than semiconductor element 3 are joined as in the present embodiment, a binder contained in the joining material particularly in the center portion in a plan view tends to remain when joining material 11 joining insulated circuit board 1 and buffer plate 5 to each other is heated and joined. This is because there is no bypass passage for a binder.

Thus, in the present embodiment, joining material 11 for joining insulated circuit board 1 and buffer plate 5 to each other is divided into a plurality of portions, for example, in a mesh shape. This can improve the efficiency of causing the binder contained in joining material 11 during heat joining to be discharged through dividing line 15 used for dividing joining material 11 to the outside of joining material 11. Even the binder in the center portion of joining material 11 can be discharged to the outside through dividing line 15. In other words, by utilizing dividing line 15 as a bypass passage for the binder evaporated by heating, the gas resulting from evaporation of the binder can be suppressed from remaining in joining material 11. Thus, as redundant gas does not remain in joining material 11, joining material 11 is to be accordingly densely packed. Therefore, the joining strength of joining material 11 can be increased, and the reliability of joining material 11 can be improved. The joining strength of joining material 11 is increased, so that the heat dissipation performance from semiconductor element 3 to insulated circuit board 1 can be further improved.

Even when joining material 11 is divided in the lateral direction along its main surface by dividing line 15, but because the width of dividing line 15 is equal to or more than 10 μm and equal to or less than the thickness of joining material 11 as described above, almost no influence is exerted upon the efficiency of heat diffusion in the lateral direction along the main surface between buffer plate 5 and insulated circuit board 1 that are joined to joining material 11.

Furthermore, when joining material 11 for example made of sintered silver and serving as the second joining material is disposed between semiconductor element 3 and buffer plate 5, the joining strength and the heat conductivity from semiconductor element 3 to buffer plate 5 can also be ensured.

In the present embodiment, particularly, joining material 11 made of sintered silver is used as the first and second joining materials. Sintered silver is higher in heat conductivity than solder. Accordingly, by using this sintered silver, the heat resistance in the heat dissipation path from semiconductor element 3 to base substrate 7 can be reduced, so that extremely excellent heat conductivity can be achieved.

Furthermore, for example, in power module 101 in FIG. 1, only first joining material 11 is divided into a plurality of portions by dividing line 15 in a plan view, but second joining material 11 and third joining material 13 are not divided by dividing line 15. Thereby, for example, as to first joining material 11, joining material 11 can be preferentially densely packed due to the bypass passage for the binder. Also, for example, as to second joining material 11 and third joining material 13, a relatively large joining area can be preferentially ensured.

Second Embodiment

Figure 4:
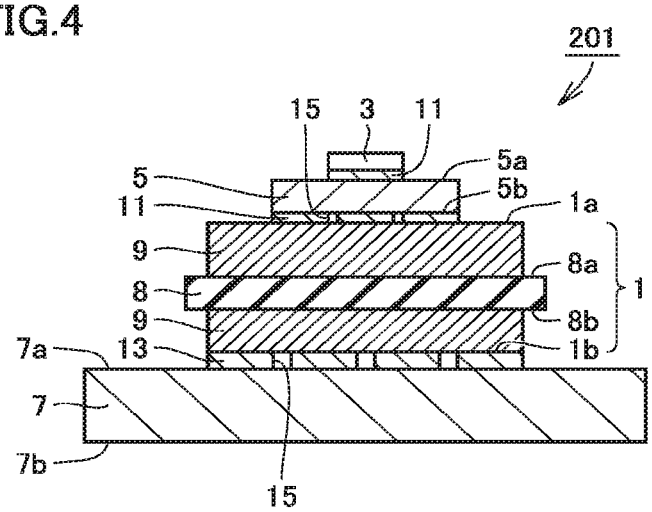
FIG. 4 is a schematic cross-sectional view showing the configuration of a power module in the second embodiment.

First, the configuration of a power module in the present embodiment will be hereinafter described with reference to FIG. 4. Referring to FIG. 4, since a power module 201 in the present embodiment has basically the same configuration as that of power module 101 in the first embodiment, the same components are designated by the same reference characters, and description thereof will not be repeated. Note that power module 201 in the present embodiment is different from power module 101 in the first embodiment in that a joining material 13 (the third joining material) disposed between insulated circuit board 1 and base substrate 7 is divided into a plurality of portions in a plan view. In other words, joining material 13 as the third joining material is divided into a plurality of portions by dividing line 15 similar to joining material 11 as the first joining material in the first embodiment shown in FIGS. 2 and 3. The manner of dividing joining material 13 in this case may be the same as that in FIG. 2 or 3.

The functions and effects of the present embodiment will then be described. The present embodiment achieves the following functions and effects in addition to the functions and effects in the first embodiment.

Like power module 101, power module 201 is configured such that the lower members in FIG. 4 are basically larger in area in a plan view than the upper members in FIG. 4. Accordingly, joining material 13 between insulated circuit board 1 and base substrate 7 is larger in plane area than joining material 11 between insulated circuit board 1 and buffer plate 5. Thus, while joining material 11 is generally made using sintered silver, joining material 13 may possibly be made using sintered silver but is generally made using solder that is lower in cost than sintered silver. Even if joining material 13 made of solder is used, but if this joining material 13 is in a paste state to be applied before joining, there is a possibility due to the binder contained in the paste that the gas resulting from evaporation of the binder during heat joining may stagnate inside joining material 13 after joining. Thus, in the present embodiment, it is effective to provide joining material 13 with dividing line 15 that serves as a path through which the gas is emitted to the outside. In this way, the gas of the binder generated during heat joining of joining material 13 made of solder can be highly efficiently emitted through dividing line 15 to the outside. Consequently, the same functions and effects as those of joining material 11 in the first embodiment can be achieved also in joining material 13.

Although not shown, when dividing line 15 is provided also in the third joining material as in the present embodiment, this joining material can be used as joining material 11 made of sintered silver. This is because the binder gas in the joining material made of sintered silver can be emitted highly efficiently through dividing line 15, so that the joining strength of the joining material made of sintered silver can be enhanced. Furthermore, by using the joining material made of sintered silver as the third joining material between insulated circuit board 1 and base substrate 7, the heat resistance in the heat dissipation path from semiconductor element 3 to base substrate 7 can be further reduced as compared with the case where the third joining material is made of solder, so that extremely excellent heat conductivity can be achieved. This is because joining material 11 made of sintered silver is higher in heat conductivity than joining material 13 made of solder.

Third Embodiment

Figure 5:
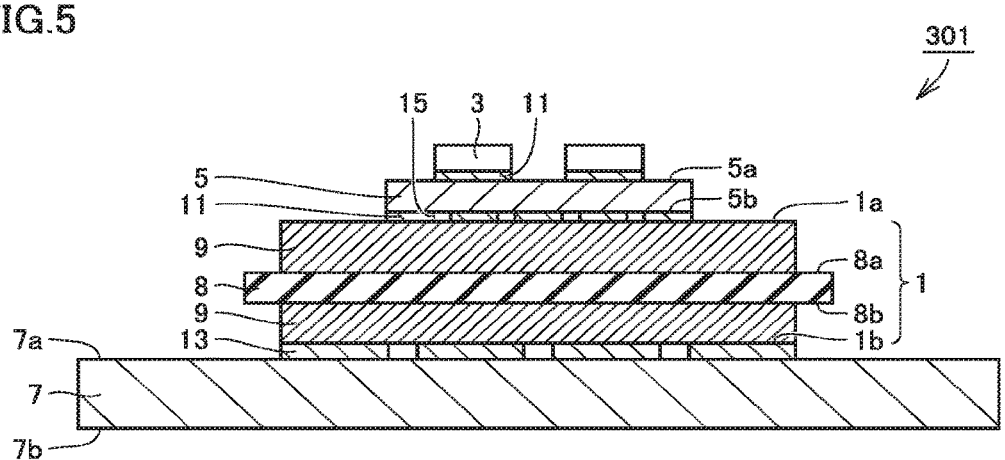
FIG. 5 is a schematic cross-sectional view showing the configuration of a power module in the third embodiment.

First, the configuration of a power module in the present embodiment will be hereinafter described with reference to FIG. 5. Referring to FIG. 5, since a power module 301 in the present embodiment has basically the same configuration as those of power modules 101 and 201 in the first and second embodiments, the same components are designated by the same reference characters, and description thereof will not be repeated. Note that power module 301 in the present embodiment is different from power modules 101 and 201 in the first and second embodiments in that a plurality of semiconductor elements 3 are arranged to be spaced apart from each other on the one main surface 1a side of insulated circuit board 1 with buffer plate 5 interposed therebetween. FIG. 5 shows a configuration in which joining material 11 between insulated circuit board 1 and buffer plate 5, and joining material 13 between insulated circuit board 1 and base substrate 7 each are divided into a plurality of portions by dividing line 15, but joining material 13 in FIG. 5 may not have dividing line 15 as in FIG. 1.

Also in the present embodiment as in the first embodiment, buffer plate 5 can cause the heat generated by semiconductor element 3 to be highly efficiently diffused in the lateral direction along its main surface while alleviating the thermal stress mainly resulting from the difference in coefficient of linear expansion between semiconductor element 3 and insulated circuit board 1. Since joining material 11 as the first joining material is divided into a plurality of portions, the gas resulting from evaporation of the binder can be highly efficiently emitted to the outside. Accordingly, joining material 11 made of sintered silver that is higher in heat conductivity than solder can be used as the first joining material, and thus, the heat resistance in the heat dissipation path from semiconductor element 3 to base substrate 7 can be reduced, so that extremely excellent heat conductivity can be achieved.

The functions and effects of the present embodiment will then be described. The present embodiment achieves the following functions and effects in addition to the functions and effects in the first and second embodiments.

Also in the present embodiment, when buffer plate 5 is made of a copper-molybdenum alloy as in the first embodiment, the electric resistivity is $2.7 \times 10^{-8}$ Ωm or more and $5.3 \times 10^{-8}$ Ωm or less. When buffer plate 5 is made of copper, the electric resistivity is $1.7 \times 10^{-8}$ Ωm. In this way, the electric resistivity of buffer plate 5 is relatively low. Accordingly, when a plurality of semiconductor elements 3 are joined onto buffer plate 5 with joining material 11 interposed therebetween, buffer plate 5 can be functioned as an electrical wiring line for electrically joining the plurality of semiconductor elements 3 to each other. Furthermore, since the plurality of semiconductor elements 3 are electrically connected to each other by buffer plate 5, the required number of electrical wiring lines are decreased, so that power module 301 can be entirely reduced in size.

Fourth Embodiment

Figure 6:
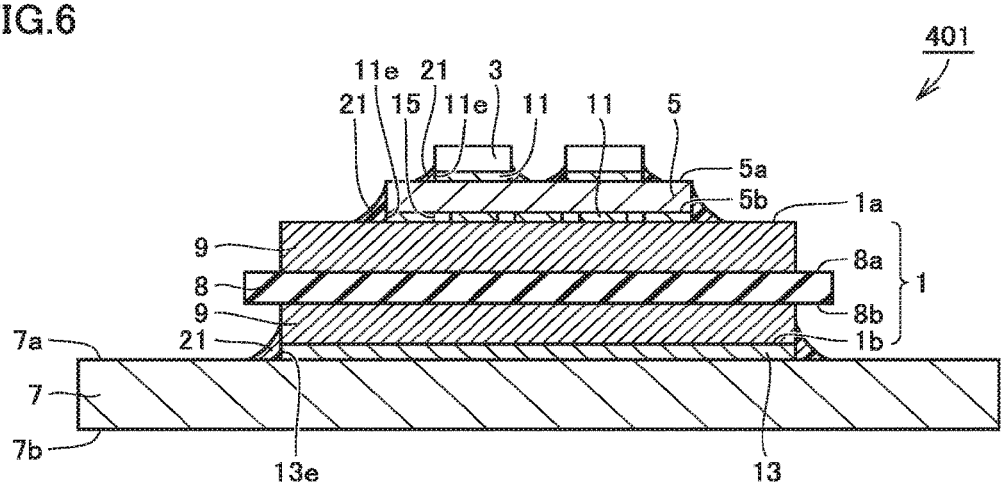
FIG. 6 is a schematic cross-sectional view showing the first example of the configuration of a power module in the fourth embodiment.

First, the configuration of a power module in the present embodiment will be hereinafter described with reference to FIG. 6. Referring to FIG. 6, since a power module 401 in the present embodiment has basically the same configuration as that of power module 101 in the first embodiment, the same components are designated by the same reference characters, and description thereof will not be repeated. Note that power module 401 in the present embodiment is different from power module 101 in the first embodiment in that a resin material 21 is disposed so as to cover a joining material end face 11e corresponding to an end face of joining material 11 serving as the first joining material. Also, power module 401 in FIG. 6 is configured as in the third embodiment that a plurality of semiconductor elements 3 are disposed on buffer plate 5 to be spaced apart from each other. However, power module 401 may also be configured as in power module 101 in the first embodiment such that only a single semiconductor element 3 is provided.

Power module 401 in FIG. 6 is provided not only with joining material end face 11e of joining material 11 as the first joining material, but also with a joining material end face 11e of joining material 11 as the second joining material and a joining material end face 13e corresponding to an end face of joining material 13 as the third joining material. As in power module 401 in FIG. 6, resin material 21 may be applied only to required portions on joining material end faces 11e and 13e. However, referring to FIG. 7, in the present embodiment, as in power module 402, resin material 21 may cover all members including insulated circuit board 1, semiconductor element 3, buffer plate 5, first joining material 11, the second joining material, and the third joining material so as to be enclosed therein.

The term "cover . . . so as to be enclosed therein" herein means that, for example, resin material 21 at least partially covers the main surfaces and/or the end faces of insulated circuit board 1, semiconductor element 3 and buffer plate 5, and also covers the end faces of first joining material 11, second joining material 11 and third joining material 13. In other words, the term "cover . . . so as to be enclosed therein" herein means that resin material 21 almost entirely covers the exposed outer surface of the stacked structure constituting a main part of power module 402 formed of insulated circuit board 1, semiconductor element 3 and the like. In addition, resin material 21 in FIG. 7 covers only one main surface 7a of base substrate 7, but resin material 21 may cover also the end face of base substrate 7, for example.

Figure 7:
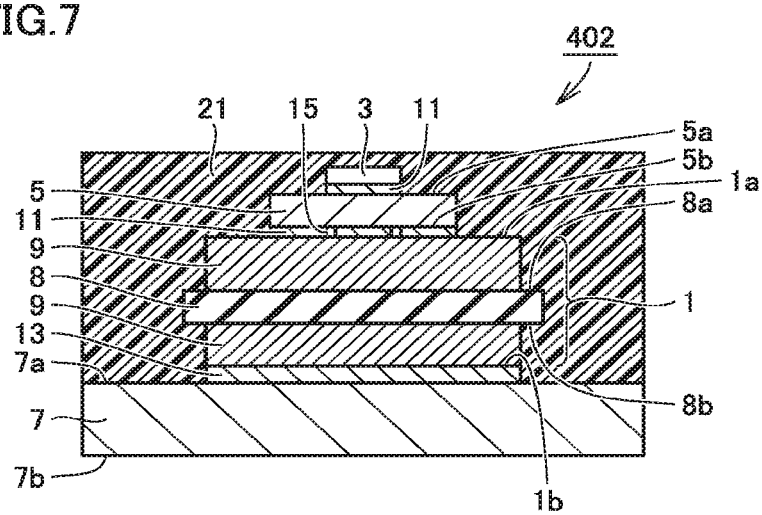
FIG. 7 is a schematic cross-sectional view showing the second example of the configuration of the power module in the fourth embodiment.

In power module 402, although not shown in FIG. 7, an electrode terminal and the like required for electrical connection between the inside and the outside of power module 402 may be formed, and resin material 21 may provide sealing such that at least a part of the electrode terminal is exposed.

The functions and effects of the present embodiment will then be described.

In the present embodiment, the effect of stress relaxation by resin material 21 can also be expected in addition to the functions and effects achieved in each of the above-described embodiments. In other words, for example, even when the effect of stress relaxation by buffer plate 5 is reduced by reducing the thickness of buffer plate 5, resin material 21 acts as a cushion, so that the load caused by thermal stress can be dispersed. Thereby, the thermal stress applied to joining material end faces 11e and 13e can be alleviated. Accordingly, in the present embodiment, buffer plate 5 can be reduced in thickness by the amount corresponding to relaxation of thermal stress as compared with the first embodiment and the like. Thereby, the heat dissipation path from semiconductor element 3 to base substrate 7 can be further shortened, so that the heat conductivity in the heat dissipation path can be accordingly improved.

Fifth Embodiment

Figure 8:
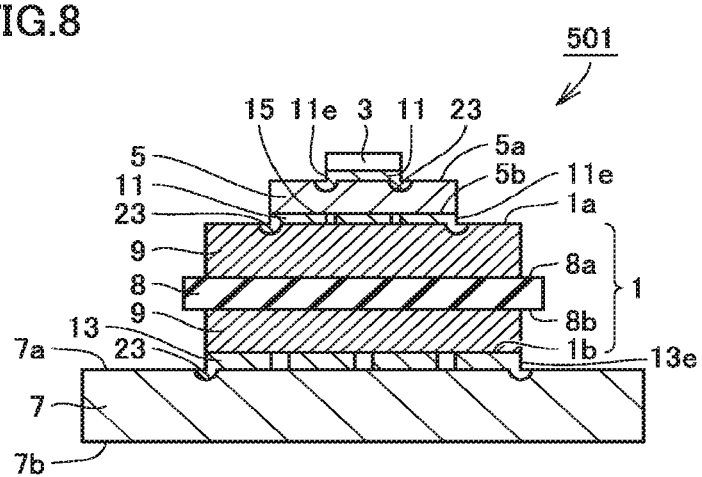
FIG. 8 is a schematic cross-sectional view showing the first example of the configuration of a power module in the fifth embodiment.

First, the configuration of a power module in the present embodiment will be hereinafter described with reference to FIG. 8. Referring to FIG. 8, since a power module 501 in the present embodiment has basically the same configuration as those of power modules 101 and 201 in the first and second embodiments, the same components are designated by the same reference characters, and description thereof will not be repeated. In this case, in power module 501 in the present embodiment, a concave portion 23 is formed in a portion located in one main surface 1a of insulated circuit board 1 and planarly overlapping with joining material end face 11e of first joining material 11. In other words, concave portion 23 recessed downward from one main surface 1a is formed in: a portion located in one main surface 1a of insulated circuit board 1 and planarly overlapping with joining material end face 11e of first joining material 11 disposed immediately above one main surface 1a (intersecting with joining material end face 11e); and a region adjacent to this portion.

Furthermore, in power module 501, in the same manner as described above, concave portion 23 recessed downward from one main surface 5a is formed in: a portion located in one main surface 5a of buffer plate 5 and planarly overlapping with joining material end face 11e of second joining material 11 disposed immediately above one main surface 5a (intersecting with joining material end face 11e); and a region adjacent to this portion. Furthermore, in power module 501, concave portion 23 recessed downward from one main surface 7a is formed in: a portion located in one main surface 7a of base substrate 7 and planarly overlapping with joining material end face 13e of third joining material 13 disposed immediately above one main surface 7a (intersecting with joining material end face 13e); and a region adjacent to this portion.

Figure 9:
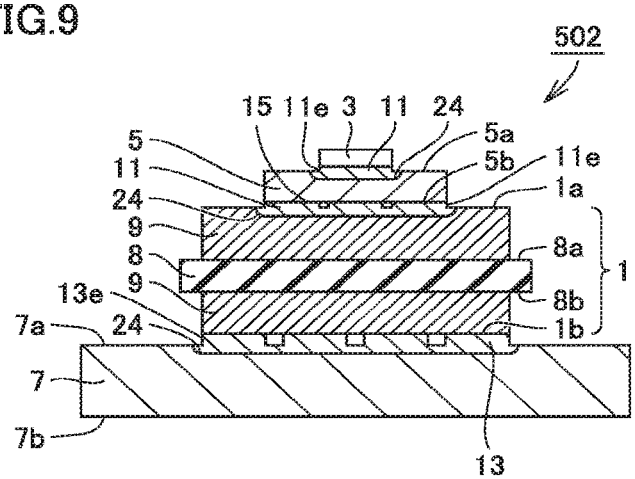
FIG. 9 is a schematic cross-sectional view showing the second example of the configuration of the power module in the fifth embodiment.

Referring to FIG. 9, as in a power module 502 in the present embodiment, a concave portion 24 may be not only formed in a portion overlapping with joining material end face 11e as described above, but also formed so as to extend almost entirely in a portion located in one main surface 1a of insulated circuit board 1 and planarly overlapping with first joining material 11 disposed immediately above one main surface 1a. Concave portion 24 is formed such that the lowermost part of the stacked structure formed of first joining material 11 immediately above concave portion 24, buffer plate 5 above first joining material 11 and the like can be placed so as to be fitted in concave portion 24. Specifically, the main surface located on the lower side of first joining material 11 and immediately above concave portion 24 is formed to extend below one main surface 1a of insulated circuit board 1 in FIG. 9 (on the side on which base substrate 7 is disposed).

Furthermore, in power module 502, in the same manner as described above, concave portion 24 may be formed to extend almost entirely in a portion located in one main surface 5a of buffer plate 5 and planarly overlapping with second joining material 11 disposed immediately above one main surface 5a. Also, in power module 502, concave portion 24 may be formed to extend almost entirely in a portion located in one main surface 7a of base substrate 7 and planarly overlapping with third joining material 13 disposed immediately above one main surface 7a. Each of these concave portions 24 is also formed such that the lowermost part of the stacked structure located above each concave portion 24 and including a corresponding one of joining materials 11 and 13 immediately above each concave portion 24 can be placed so as to be fitted in each concave portion 24.

In FIGS. 8 and 9, joining material 11 between insulated circuit board 1 and buffer plate 5, and joining material 13 between insulated circuit board 1 and base substrate 7 each are configured to be divided into a plurality of portions by dividing line 15, but joining material 13 in each of FIGS. 8 and 9 does not need to have dividing line 15 as in FIG. 1.

The functions and effects of the present embodiment will then be described. The present embodiment achieves the following functions and effects in addition to the functions and effects in each of the above-described embodiments.

In the present embodiment, since concave portion 23 is provided as described above, joining materials 11 and 13 located immediately above concave portions 23 flow into concave portions 23, thereby increasing the thickness of each of joining materials 11 and 13. In other words, in the present embodiment, end faces 11e and 13e of joining materials 11 and 13 immediately above concave portions 23 and the regions adjacent to end faces 11e and 13e can be formed thicker than other regions. Accordingly, the thermal stress applied to joining materials 11 and 13 can be alleviated. Concave portion 24 can also be similarly formed such that joining materials 11 and 13 flow into concave portions 24, with the result that joining materials 11 and 13 located in concave portions 24 can be accordingly increased in thickness. Thus, the thermal stress applied to joining materials 11 and 13 can be alleviated. Therefore, in the present embodiment, buffer plate 5 can be reduced in thickness by the amount corresponding to relaxation of thermal stress as compared with the first embodiment and the like. Thereby, the heat dissipation path from semiconductor element 3 to base substrate 7 can be further shortened, so that the heat conductivity in the heat dissipation path can be accordingly improved.

Sixth Embodiment

Figure 10:
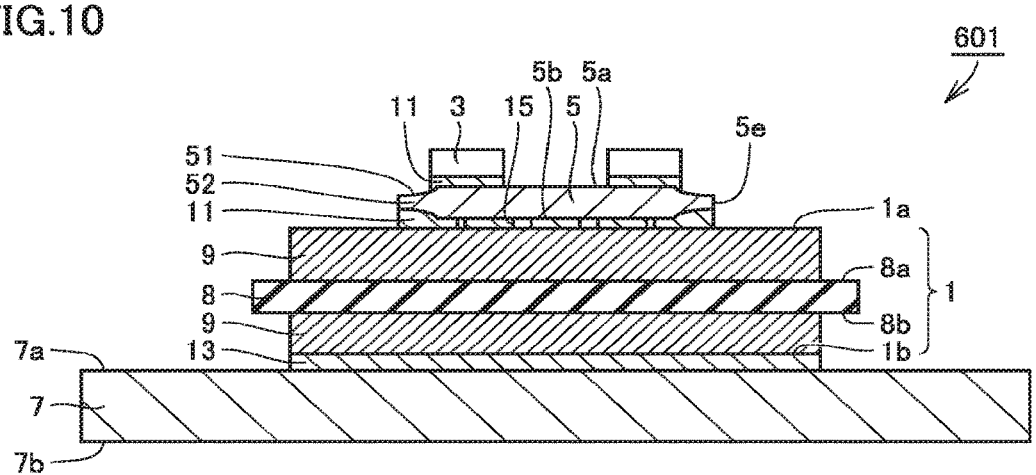
FIG. 10 is a schematic cross-sectional view showing the configuration of a power module in the sixth embodiment.

The configuration of a power module in the present embodiment will be hereinafter described with reference to FIG. 10. Referring to FIG. 10, since a power module 601 in the present embodiment has basically the same configuration as those of power modules 101 and 201 in the first and second embodiments, the same components are designated by the same reference characters, and description thereof will not be repeated. However, in power module 601 in the present embodiment, buffer plate 5 is formed thinner in a region adjacent to a buffer plate end face 5e corresponding to an end face thereof than other regions excluding this adjacent region, in which the adjacent region has a surface on which buffer plate inclination portions 51 and 52 are formed. Into such the thinned portion of buffer plate 5, joining material 11 located immediately above buffer plate 5 or immediately below buffer plate 5 flows, where joining material 11 is thereby formed thicker than other regions. Accordingly, joining material 11 is formed thicker in a region planarly overlapping with the thinned portion of buffer plate 5 adjacent to buffer plate end face 5e than in other regions excluding this planarly overlapping region.

In power module 601 in FIG. 10, as in the third embodiment, a plurality of semiconductor elements 3 are disposed on buffer plate 5 to be spaced apart from each other. However, also in power module 601, only a single semiconductor element 3 may be disposed as in power module 101 in the first embodiment.

The functions and effects of the present embodiment will then be described.

In the present embodiment, buffer plate 5 is formed to have a region that is reduced in thickness by buffer plate inclination portions 51 and 52, as described above. Thus, joining material 11 located immediately above or below buffer plate inclination portions 51 and 52 and covering these buffer plate inclination portions 51 and 52 is formed thicker than joining material 11 covering the region excluding buffer plate inclination portions 51 and 52. Accordingly, the thermal stress applied to joining material 11 can be alleviated. Thus, in the present embodiment, buffer plate 5 can be reduced in thickness by the amount corresponding to relaxation of thermal stress as compared with the first embodiment and the like. Thereby, the heat dissipation path from semiconductor element 3 to base substrate 7 can be further shortened, so that the heat conductivity in the heat dissipation path can be accordingly improved.

Seventh Embodiment

Figure 11:
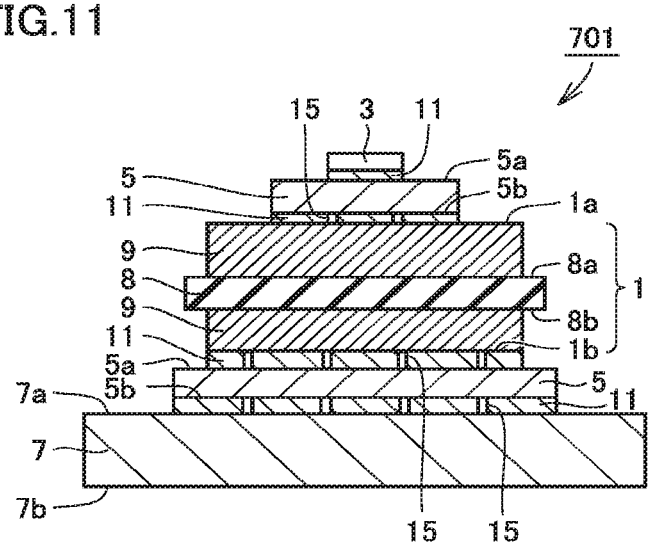
FIG. 11 is a schematic cross-sectional view showing the first example of the configuration of a power module in the seventh embodiment.

The configuration of a power module in the present embodiment will be hereinafter described with reference to FIG. 11. Referring to FIG. 11, since a power module 701 in the present embodiment has basically the same configuration as those of power modules 101 and 201 in the first and second embodiments, the same components are designated by the same reference characters, and description thereof will not be repeated. However, power module 701 in the present embodiment is different from those in the first embodiment and the like in that buffer plate 5 (the second buffer plate) is disposed between insulated circuit board 1 and base substrate 7.

Like buffer plate 5 serving as the first buffer plate, buffer plate 5 serving as the second buffer plate is formed in a flat plate shape having one main surface 5a on the upper side in FIG. 11 and the other main surface 5b on the lower side in FIG. 11. Buffer plate 5 as the second buffer plate is formed of a material having a coefficient of linear expansion showing a value intermediate between the coefficient of linear expansion of insulated circuit board 1 and the coefficient of linear expansion of base substrate 7.

In power module 701, one main surface 5a of second buffer plate 5 and insulated circuit board 1 are joined to each other by joining material 11 made of sintered silver while the other main surface 5b of second buffer plate 5 and base substrate 7 are also joined to each other by joining material 11 made of sintered silver. However, the joining material disposed between second buffer plate 5 and base substrate 7 may be third joining material 13 as described above. In addition, joining material 11 on one main surface 5a of second buffer plate 5 is larger in plane area than joining material 11 on one main surface 5a of first buffer plate 5. Accordingly, for the purpose of excellently joining insulated circuit board 1 and second buffer plate 5, it is preferable that dividing line 15 is provided also in joining material 11 corresponding to this joining portion.

The functions and effects of the present embodiment will then be described.

Particularly when insulated circuit board 1 and base substrate 7 are joined to each other by joining material 11 made of sintered silver, the difference in coefficient of linear expansion between the sintered silver and each member adjacent thereto is increased. Accordingly, it is preferable that buffer plate 5 is sandwiched between insulated circuit board 1 and base substrate 7. In this way, from the similar viewpoint about buffer plate 5 in the first embodiment, the difference between the coefficients of linear expansion is decreased, so that the thermal stress can be alleviated.

Figure 12:
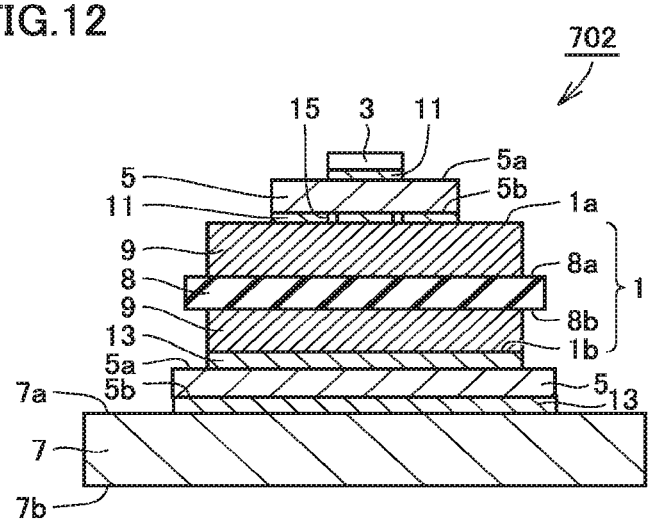
FIG. 12 is a schematic cross-sectional view showing the second example of the configuration of the power module in the seventh embodiment.

However, referring to FIG. 12, also when buffer plate 5 is provided on the other main surface 1b side of insulated circuit board 1 as in the present embodiment, joining material 13 made of solder may be provided so as to cover one main surface 5a and the other main surface 5b of second buffer plate 5 as in power module 702. Also in FIG. 12, dividing line 15 is not provided in joining material 13 on the other main surface 5b of second buffer plate 5, but dividing line 15 may be provided also in this joining material 13.

Eighth Embodiment

Figure 13:
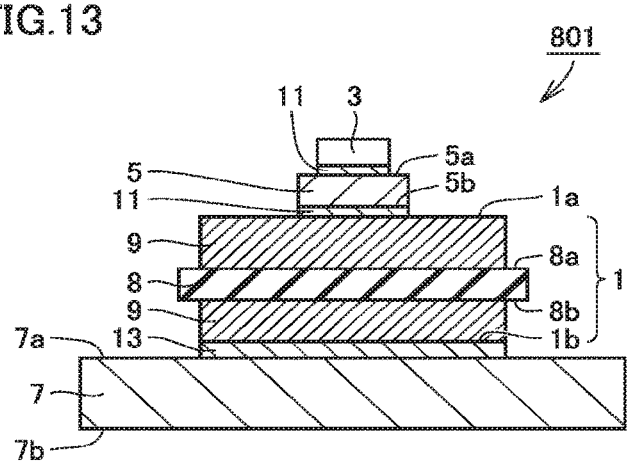
FIG. 13 is a schematic cross-sectional view showing the first example of the configuration of a power module in the eighth embodiment.

Referring to FIG. 13, in a power module 801 in the first example of the eighth embodiment, first joining material 11 disposed between insulated circuit board 1 and first buffer plate 5 is not divided into a plurality of portions by dividing line 15, but a single region extends entirely in a plan view. In this point, FIG. 13 is structurally different from FIG. 1 showing the first embodiment in which joining material 11 is divided into a plurality of portions.

Figure 14:
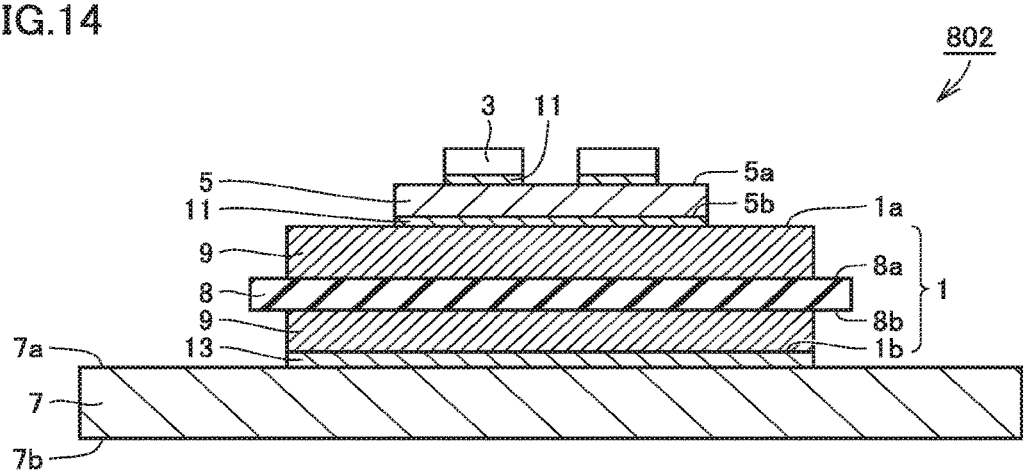
FIG. 14 is a schematic cross-sectional view showing the second example of the configuration of the power module in the eighth embodiment.

Referring to FIG. 14, in a power module 802 in the second example of the eighth embodiment, as in FIG. 5 showing the third embodiment, a plurality of semiconductor elements 3 are disposed to be spaced apart from each other on the one main surface 1a side of insulated circuit board 1 with buffer plate 5 interposed therebetween. However, in FIG. 14, each of first joining material 11 disposed between insulated circuit board 1 and first buffer plate 5, and third joining material 13 disposed between insulated circuit board 1 and base substrate 7 is not divided into a plurality of portions by dividing line 15, but a single region extends entirely in a plan view. In this point, FIG. 14 is structurally different from FIG. 5 showing the third embodiment in which each of joining materials 11 and 13 is divided into a plurality of portions.

The configurations in FIGS. 13 and 14 are different from the configurations in FIG. 1 and FIG. 5, respectively, only in the above-described points, but are identical in other points to the configurations in FIGS. 1 and 5, respectively. Accordingly, the same components are designated by the same reference characters, and description thereof will not be repeated.

Even in the configuration in which joining materials 11 and 13 each do not have dividing line 15 as in the present embodiment, it is preferable to arrange, at least between insulated circuit board 1 and semiconductor element 3, buffer plate 5 having a coefficient of linear expansion showing a value intermediate between the coefficient of linear expansion of insulated circuit board 1 and the coefficient of linear expansion of semiconductor element 3. Thereby, the thermal stress resulting from the difference in coefficient of linear expansion between insulated circuit board 1 and semiconductor element 3 can be alleviated, fatigues and cracks in the joining portion can be suppressed, and progress of cracks can be delayed. Also, by buffer plate 5, the heat transmitted downwardly from semiconductor element 3 can be highly efficiently diffused in the lateral direction along the main surface of buffer plate 5. Thus, the heat resistance in the heat path extending from semiconductor element 3 as a heat generating body downwardly in FIG. 1 to base substrate 7 is extremely reduced, so that excellent heat conductivity can be achieved.

Ninth Embodiment

Figure 15:
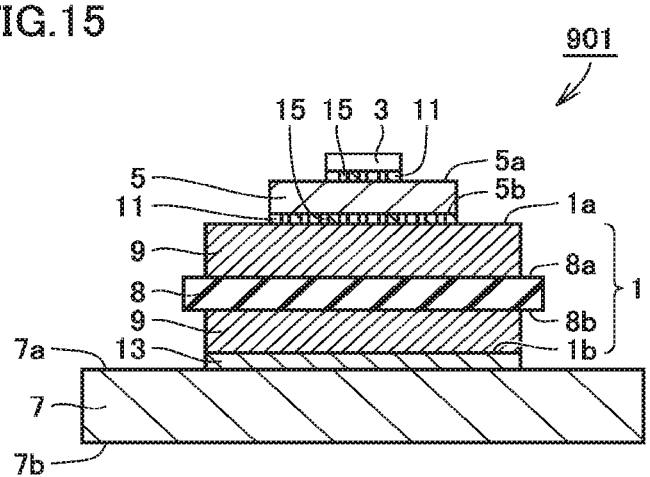
FIG. 15 is a schematic cross-sectional view showing the first example of the configuration of a power module in the ninth embodiment.

First, the configuration of a power module in the first example of the present embodiment will be hereinafter described with reference to FIG. 15. Referring to FIG. 15, since a power module 901 in the first example of the present embodiment has basically the same configuration as that of power module 101 in the first embodiment, the same components are designated by the same reference characters, and description thereof will not be repeated. However, in power module 901 in the first example of the present embodiment, the number of dividing lines 15 in first joining material 11 is increased, and dividing line 15 is provided also in second joining material 11 between semiconductor element 3 and first buffer plate 5, and divided into a plurality of portions in a plan view. In the above-described points, power module 901 is different from power module 101 in the first embodiment.

Also in the first example in the present embodiment, as in the first embodiment, the paste material for forming joining material 11 is applied by methods such as a commonly known screen printing method or a dispenser applying method. Alternatively, for example, a method of affixing a sheet-shaped joining material in a semidry state onto one main surface 1a may be used. In any of the cases, when this material is sintered, the thickness of joining material 11 and the width of dividing line 15 (the width in the direction along one main surface 1a of insulated circuit board 1) are changed in accordance with the type, the amount and the like of the binder contained in the paste material. Accordingly, the size obtained after sintering of joining material 11 will be hereinafter also described as in the first embodiment.

In the present embodiment, it is preferable that the plane area of the portion corresponding to dividing line 15 along which second joining material 11 is divided into a plurality of portions is equal to or less than 20% of the plane area of semiconductor element 3, and that the width of dividing line 15 (in the right-left direction in FIG. 15) is equal to or less than the thickness of second joining material 11 (in the up-down direction in FIG. 15). In other words, joining material 11 does not exist in the portion corresponding to dividing line 15, where semiconductor element 3 and buffer plate 5 are not joined to each other. In this way, when the area of the portion corresponding to dividing line 15 in a plan view along which semiconductor element 3 and buffer plate 5 are not joined to each other is equal to or less than 20% of the area of semiconductor element 3 in a plan view, but as long as the width of dividing line 15 is equal to or less than the thickness of second joining material 11, then, the heat resistance in the portion corresponding to second joining material 11 is hardly increased as compared with the case where dividing line 15 does not exist.

The same also applies, for example, to the case where dividing lines 15 are formed vertically and horizontally such that the width of dividing line 15 in second joining material 11 is 10 µm and the pitch between one pair of adjacent dividing lines 15 is 0.2 mm (see FIG. 2); and to the case where the width of dividing line 15 in second joining material 11 is 20 µm. In other words, even when the width of dividing line 15 is 10 µm or 20 µm, but as long as the total area of the portion corresponding to dividing line 15 in a plan view is equal to or less than 20% of the total area of semiconductor element 3, and as long as the width of dividing line 15 is equal to or less than the thickness of second joining material 11, then, the heat resistance in the portion corresponding to second joining material 11 is hardly increased as compared with the case where dividing line 15 does not exist. The same applies also to the case where the thickness of semiconductor element 3 is for example thinner than 100 µm to 400 µm in FIG. 15, and for example reduced in thickness to about 50 µm.

Furthermore, it is preferable that dividing line 15 extends continuously from the center portion toward the end of second joining material 11 in a plan view.

Then, the functions and effects in FIG. 15 showing the first example in the present embodiment will be hereinafter described. The present embodiment achieves the following functions and effects in addition to the functions and effects in the first embodiment.

As compared with power module 101 in FIG. 1, in power module 901 in FIG. 15, the number of dividing lines 15 in first joining material 11 is increased and dividing line 15 is provided also in second joining material 11. Accordingly, when the bypass passage for the binder in first joining material 11 is increased in number as compared with the first embodiment, joining material 11 is densely packed, with the result that its joining strength can be further increased, and its heat dissipation performance can be further improved. Even when the number of dividing lines 15 is increased as described above, but when the area occupied by the portions corresponding to dividing lines 15 in the area of the entire region overlapping with semiconductor element 3 is equal to or less than 20%, and when the width of each dividing line 15 is equal to or less than the thickness of joining material 11, then, the heat resistance in first joining material 11 is hardly increased, so that its heat dissipation performance can be kept high.

Furthermore, by providing dividing line 15 also in second joining material 11, the number of bypass passages for the binder is increased also in second joining material 11 as in first joining material 11, so that joining material 11 is densely packed. Thereby, the joining strength can be further increased, and the heat dissipation performance can be further improved.

The following is a review of the configuration in which a plurality of dividing lines 15 are formed vertically and horizontally as in FIG. 2, for example, such that the width of dividing line 15 in second joining material 11 is 10 µm, and the pitch between one pair of adjacent dividing lines 15 is 0.2 mm. Even if this configuration is modified so as to increase the width of each dividing line 15 in second joining material 11 to 20 µm, but when the area occupied by the plane area of this dividing line 15 in the area of the entire region overlapping with semiconductor element 3 is equal to or less than 20%, and when the width of dividing line 15 is equal to or less than the thickness of joining material 11, the heat resistance in first joining material 11 is hardly increased, so that its heat dissipation performance can be kept high.

In this way, in each of first joining material 11 and second joining material 11, even when the number of dividing lines 15 is increased, the heat resistance is hardly increased. Accordingly, joining material 11 can be reduced in size in a plan view, and dividing line 15 can be functioned as a stress buffer structure. In other words, by increasing the number of dividing lines 15 in joining material 11, the effect of alleviating the stress in the portion corresponding to joining material 11 can be improved while the heat conductivity is kept high. This is because, when the number of dividing lines 15 is increased, the portion corresponding to joining material 11 is reduced, so that the thermal stress can be alleviated.

The same also applies, for example, to the case where semiconductor element 3 is reduced in thickness to about 50 µm, as described above. Particularly in the case where the Young's modulus of semiconductor element 3 is equal to or less than 430 GPa but relatively close to 430 GPa (as long as the width of dividing line 15 is equal to or less than the thickness of joining material 11), the load of the stress applied to first and second joining materials 11 can be further reduced by reducing the thickness of semiconductor element 3. This is because, when semiconductor element 3 is reduced in thickness, semiconductor element 3 can readily follow deformation of insulated circuit board 1 caused by thermal stress. Thereby, first buffer plate 5 can be reduced in thickness, so that the heat resistance between semiconductor element 3 and insulated circuit board 1 can be further decreased.

In power module 901 in FIG. 15, the widths of dividing lines 15 in first and second joining materials 11 may not be entirely the same. Specifically, for example, the proportion of the area of dividing line 15 in the center portion of joining material 11 in a plan view may be reduced to thereby increase the proportion of the area in which joining material 11 is arranged, the proportion of the area of dividing line 15 at the end of joining material 11 in a plan view may be increased to thereby reduce the proportion of the area in which joining material 11 is arranged. In this way, the heat resistance in joining material 11 can be reduced in the region overlapping with the center portion of semiconductor element 3, and the effect of alleviating the surrounding stress can be increased, so that deterioration of the original function of joining material 11 can be suppressed.

Figure 16:
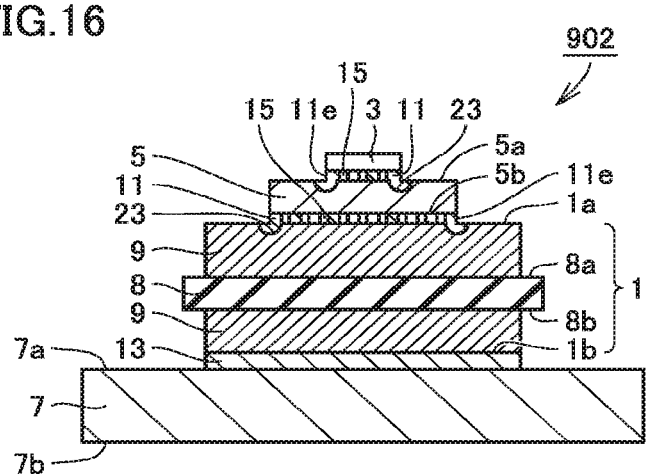
FIG. 16 is a schematic cross-sectional view showing the second example of the configuration of the power module in the ninth embodiment.

Then, the configuration of a power module in the second example of the present embodiment will be hereinafter described with reference to FIG. 16. Referring to FIG. 16, since a power module 902 in the second example of the present embodiment has basically the same configuration as that of power module 901 in FIG. 15, the same components are designated by the same reference characters, and description thereof will not be repeated. However, in power module 902 in FIG. 16, a concave portion 23 is formed in a portion located in one main surface 1a of insulated circuit board 1 and planarly overlapping with joining material end face 11e of first joining material 11, as in power module 501 in FIG. 8. In this point, power module 902 is different from power module 501. In addition, in power module 902, a concave portion 23 recessed downward from one main surface 5a is formed in: a portion located in one main surface 5a of buffer plate 5 and planarly overlapping with a joining material end face 11e of second joining material 11 disposed immediately above one main surface 5a (intersecting with joining material end face 11e); and a region adjacent to this portion, as in power module 501 in FIG. 8.

For forming joining material 11 immediately above concave portion 23, for example, when a paste material is applied by the screen printing method, it is preferable that the amount of the paste material to be applied to the end of joining material 11 that is adjacent to concave portion 23 is larger than that applied in other regions. Alternatively, for forming joining material 11 immediately above concave portion 23, for example, when a paste material is applied by the dispenser applying method, it is preferable that the paste material is applied more onto concave portion 23 than onto other regions. In this way, joining material 11 can be formed thicker immediately above concave portion 23 than other regions. The same also applies to the above-described fifth embodiment.

Then, the functions and effects of power module 902 will be hereinafter described. In power module 902, concave portion 23 is formed particularly at the ends with high stress loads in first and second joining materials 11, as in the fifth embodiment. Accordingly, joining materials 11 and 13 located immediately above concave portions 23 flow into these concave portions 23, so that joining materials 11 and 13 are to be thicker than other regions. Thus, the thermal stress applied to joining materials 11 and 13 can be alleviated. Therefore, power module 902 can be increased in lifetime than power module 901.

In addition, only one semiconductor element 3 is provided in each of power modules 901 and 902 in FIGS. 15 and 16, respectively. However, each example in the present embodiment may be applied to the configuration including a plurality of semiconductor elements 3, for example, as in the third embodiment.

As described above, in the present embodiment, only first and second joining materials 11 each are divided into a plurality of portions by dividing line 15 in a plan view, but third joining material 13 is not divided by dividing line 15. Thereby, for example, as to first and second joining materials 11, joining material 11 can be preferentially densely packed due to the bypass passage for the binder. For example, as to third joining material 13, a relatively large joining area can be preferentially ensured.

Tenth Embodiment

The configuration of a power module in the first example of the present embodiment will be hereinafter described with reference to FIG. 17. Referring to FIG. 17, since a power module 1001 in the first example of the present embodiment has basically the same configuration as that of power module 901 in the ninth embodiment, the same components are designated by the same reference characters, and description thereof will not be repeated. However, power module 1001 in the first example of the present embodiment is structurally different from power module 901 in that first buffer plate 5 and first joining material 11 immediately below first buffer plate 5 are not disposed.

Specifically, power module 1001 in FIG. 17 includes: an insulated circuit board 1; a semiconductor element 3 located on the one main surface 1a side of insulated circuit board 1; a second joining material 11 disposed between insulated circuit board 1 and semiconductor element 3; and a base substrate 7 disposed on the other main surface 1b side of insulated circuit board 1. Second joining material 11 is divided into a plurality of portions by a dividing line 15 in a plan view. Also, a third joining material 13 is disposed between insulated circuit board 1 and base substrate 7, but dividing line 15 is not provided in this third joining material 13. Furthermore, the plane area of dividing line 15 in second joining material 11 is equal to or less than 20% of the plane area of semiconductor element 3, and the width of dividing line 15 is equal to or less than the thickness of second joining material 11.

In power module 1001, insulated circuit board 1 is higher in coefficient of linear expansion than the semiconductor element by the amount equal to or less than $3 \times 10^{-6}/°C$. In other words, the difference in coefficient of linear expansion between insulated circuit board 1 and semiconductor element 3 is relatively small as compared with that in each of the above-described embodiments. In each of the above-described points, power module 1001 is different from power module 901.

Then, the functions and effects in FIG. 17 showing the first example in the present embodiment will be hereinafter described. The present embodiment achieves the following functions and effects in addition to the functions and effects in the ninth embodiment.

The difference in coefficient of linear expansion between insulated circuit board 1 and semiconductor element 3 is relatively small as compared with that in each of the above-described embodiments. Thus, the number of dividing lines 15 in second joining material 11 is increased as compared with those in the first embodiment and the like, so that the portion corresponding to dividing line 15 can be functioned as a stress buffer structure. In other words, by increasing the number of dividing lines 15 in joining material 11, the portion corresponding to joining material 11 is decreased in accordance with such the increased number of dividing lines 15, with the result that the thermal stress can be alleviated. This can lead to a configuration not including buffer plate 5. Accordingly, as compared with other embodiments, the heat resistance in the entire region from semiconductor element 3 to base substrate 7 can be significantly reduced due to no presence of buffer plate 5.

Then, the configuration of a power module in the second example of the present embodiment will be hereinafter described with reference to FIG. 18. Referring to FIG. 18, since a power module 1002 in the second example of the present embodiment has basically the same configuration as that of power module 1001 in FIG. 17, the same components are designated by the same reference characters, and description thereof will not be repeated. However, in FIG. 18, a concave portion 23 is formed in: a portion located in one main surface 1a and planarly overlapping with joining material end face 11e of second joining material 11; and a portion located in one main surface 7a and planarly overlapping with joining material end face 13e of third joining material 13, as in FIG. 16 and the like. By providing such concave portions 23, the same functions and effects as those of concave portions 23 in the fifth and ninth embodiments can be achieved.

In addition, power modules 1001 and 1002 in FIGS. 17 and 18, respectively, may be applied to the configuration including a plurality of semiconductor elements 3, for example, as in the third embodiment.

Eleventh Embodiment

Referring to FIG. 19, a power module 1101 in the present embodiment has basically the same configuration as that of power module 1001. However, in power module 1101, semiconductor element 3 is reduced in thickness as compared with that in power module 1001. Specifically, semiconductor element 3 has a thickness equal to or less than 100 μm, and more preferably of about 50 μm.

Particularly, in the case where the Young's modulus of semiconductor element 3 is equal to or less than 430 GPa, but relatively close to 430 GPa, the load of stress applied to second joining material 11 can be further reduced by reducing the thickness of semiconductor element 3. This is because, when semiconductor element 3 is reduced in thickness, semiconductor element 3 can readily follow deformation of insulated circuit board 1 caused by thermal stress. This can lead to a configuration not including buffer plate 5.

Even when the heat conductivity in semiconductor element 3 in the lateral direction (the right-left direction in FIG. 19) is reduced by the reduced thickness of semiconductor element 3, but as long as the plane area of dividing line 15 in joining material 11 is equal to or less than 20% of the plane area of semiconductor element 3, and as long as the width of dividing line 15 is equal to or less than the thickness of joining material 11, the heat resistance in joining material 11 is approximately the same as that in power module 1001 in which semiconductor element 3 is not reduced in thickness.

Accordingly, in the present embodiment, even when semiconductor element 3 is reduced in thickness, the stress load to joining material 11 can be reduced without significantly increasing the heat resistance in entire power module 1101. Thus, the stress of second joining material 11 can be alleviated, so that the lifetime of power module 1101 can be increased.

The characteristics described in (each example included in) each of the above embodiments may be applied so as to be combined as appropriate within the range where technical inconsistency does not occur.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 insulated circuit board, 1a, 5a, 7a, 8a one main surface, 1b, 5b, 7b, 8b the other main surface, 3 semiconductor element, 5 buffer plate, 5e buffer plate end face, 7 base substrate, 8 insulating ceramic plate, 9 conductor thin film, 11, 13 joining material, 11e, 13e joining material end face, 15 dividing line, 21 resin material, 23, 24 concave portion, 51, 52 buffer plate inclination portion, 101, 201, 301, 401, 402, 501, 502, 601, 701, 702, 801, 802, 901, 902, 1001, 1002, 1101 power module.

The invention claimed is:
1. A power module comprising:
an insulated circuit board;
a semiconductor element disposed on a side of one main surface of the insulated circuit board;
a first buffer plate disposed between the insulated circuit board and the semiconductor element;
a first joining material disposed between the insulated circuit board and the first buffer plate;
a second joining material disposed between the semiconductor element and the first buffer plate; and
a heat dissipation member disposed on a side of the other main surface on an opposite side of the one main surface of the insulated circuit board,
the first joining material being divided into a plurality of portions in a plan view, and configured to join the insulated circuit board and the first buffer plate,
the first buffer plate being higher in coefficient of linear expansion than the semiconductor element and lower in coefficient of linear expansion than the insulated circuit board,
the first buffer plate being lower in Young's modulus than the semiconductor element,
the coefficient of linear expansion of the insulated circuit board being $4.8 \times 10^{-6}/°$ C. or more and $14.5 \times 10^{-6}/°$ C. or less, and the Young's modulus of the first buffer plate being less than 430 GPa.

2. The power module according to claim 1, wherein the second joining material is divided into a plurality of portions in a plan view.

3. The power module according to claim 1, wherein only each of the first joining material and the second joining material is divided into a plurality of portions in a plan view.

4. The power module according to claim 2, wherein
a plane area of a dividing line used for dividing the second joining material into a plurality of portions is equal to or less than 20% of a plane area of the semiconductor element, and
a width of the dividing line in a direction along the one main surface is equal to or less than a thickness of the second joining material.

5. The power module according to claim 1, wherein only the first joining material is divided into a plurality of portions in a plan view.

6. The power module according to claim 1, wherein the first joining material is made of a low-temperature sintered material made using silver nanoparticles.

7. The power module according to claim 1, wherein the insulated circuit board and the first buffer plate are larger in area in a plan view than the semiconductor element.

8. The power module according to claim 1, wherein a plurality of semiconductor elements are disposed on the side of the one main surface of the insulated circuit board.

9. The power module according to claim 1, wherein a resin material is disposed to cover an end face of the first joining material.

10. The power module according to claim 9, wherein the resin material covers the insulated circuit board, the semiconductor element, the first buffer plate, and the first joining material so as to be enclosed.

11. The power module according to claim 1, wherein a concave portion is formed in a portion located in the one main surface of the insulated circuit board and planarly overlapping with an end face of the first joining material.

12. The power module according to claim 11, wherein the concave portion is formed in a portion located in the one main surface of the insulated circuit board and planarly overlapping with the first joining material.

13. The power module according to claim 1, wherein
the first buffer plate is formed thinner in a region adjacent to an end face of the first buffer plate than in a region excluding the region adjacent to the end face, and
the first joining material is formed thicker in a region planarly overlapping with the region adjacent to the end face than in a region excluding the region planarly overlapping with the region adjacent to the end face.

14. The power module according to claim 1, further comprising:
a second buffer plate disposed between the insulated circuit board and the heat dissipation member; and
a third joining material disposed between the second buffer plate and the heat dissipation member, wherein the third joining material is divided into a plurality of portions in a plan view.

* * * * *